PRECISION VARIABLE DELAY PULSE GENERATOR

Filed June 24, 1959 2 Sheets-Sheet 1

INVENTOR.
ROBERT J. PRICE

BY

Paul N. Critchlow
ATTORNEYS

May 7, 1963 R. J. PRICE 3,089,090
PRECISION VARIABLE DELAY PULSE GENERATOR
Filed June 24, 1959 2 Sheets-Sheet 2

INVENTOR.
ROBERT J. PRICE
BY
ATTORNEYS 3,089,090
Patented May 7, 1963

3,089,090

PRECISION VARIABLE DELAY PULSE GENERATOR

Robert J. Price, Rte. 1, Box 635, Lakeside, Calif.
Filed June 24, 1959, Ser. No. 822,700
4 Claims. (Cl. 328—55)
(Granted under Title 35, U.S. Code (1952), sec. 266)

The invention described herein may be manufactured and used by or for the Government of the United States of America for governmental purposes without the payment of any royalties thereon or therefor.

This invention relates to a precision variable delay pulse generator and more particularly to a precision variable delay pulse generator utilizing passive delay elements as the basis for accuracy.

In the prior art the most widely used system for producing a precision variable delayed pulse employed a sinusoidal wave provided from a crystal oscillator which was phase shifted through a rotary phase shifting device. The given cycle which corresponded to the delay time to be measured was then selected by some form of binary counters. The rotary phase shifter was utilized to give a fine vernier measure. These techniques have the disadvantage of requiring very complex circuitry and in many cases components and assemblies of very close tolerance. Accompanying the complex circuitry are the disadvantages of instability, unreliability, and difficulty in servicing by the inexperienced technician in the field.

It is thus an object of the present invention to provide a precision variable delay pulse generator with an accuracy tolerance determined only by passive networks.

Another object is the provision of a precision variable delay pulse generator which is extremely stable and reliable.

A further object of the invention is to provide a precision variable delay pulse generator in which a minimum of precision components is required.

Still another object is to provide a precision variable delay pulse generator utilizing many similar circuits and thereby reducing the servicing problem in the field.

A still further object of the invention is to provide a precision variable delay pulse generator which is compact, simple, inexpensive and requires a minimum of calibration and adjustment.

According to the invention a reference pulse from external equipment is applied to a pulse train generator consisting of a gating multivibrator which in turn gates on a crystal or precision oscillator, the output of which is shaped to form sharp pulses. These pulses are applied to a first delay line having a total delay equal to the period of the precision oscillator, and to one input of a coincidence circuit. The synchronizing pulse is also applied through a shaping network to a last time delay line having a total delay time at least as great as the longest delay time of interest. The synchronizing pulse is also applied through separate pulse shaping circuits to a plurality of delay lines each having a total delay time varying in increments to a time greater than the first delay line through a time less than the last delay line. Each of these delay lines employs a feedback circuit in which the output is connected to a coincidence circuit and a pulse shaping network back to the input. The second input to the coincidence circuit is coupled from the input of the previous delay line i.e. that delay line having the next shortest delay time increment. Each delay line has a plurality of incremental output taps which are coupled through one section of a geared rotary switch to further coincidence circuits thereby resulting in an output pulse delayed in time by an amount determined by the setting of the various sections of the timing switch, and, of course, the delay time of the various delay lines and frequency of the precision oscillator.

Other objects and many of the attendant advantages of this invention will be readily appreciated as same becomes better understood by reference to the following detailed description when considered in connection with the accompanying drawings in which like references designate like parts throughout the figures thereof and wherein.

Figure 1:
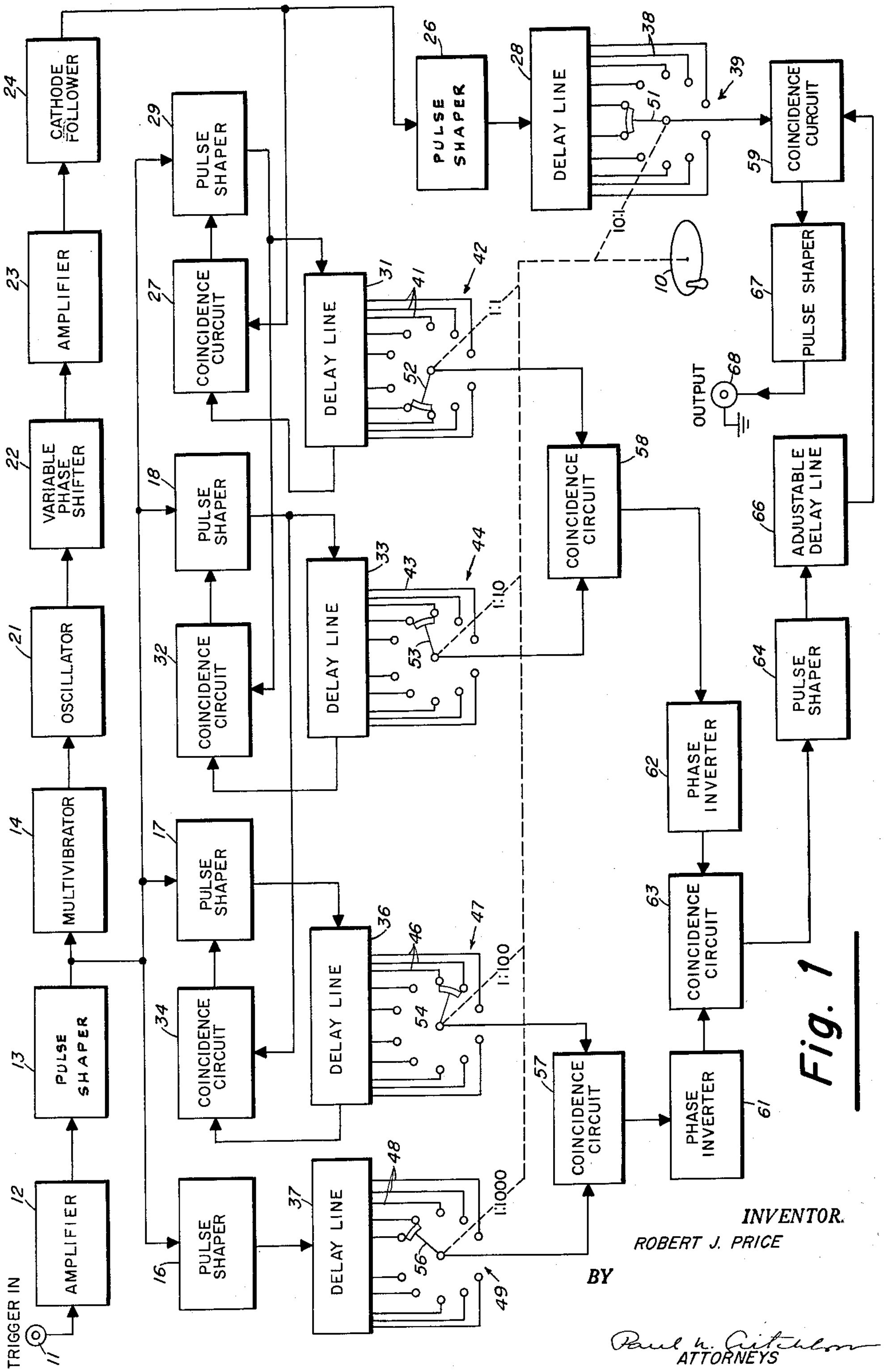
FIG. 1 is a blocked diagram of a preferred embodiment of the invention.

Referring now to FIG. 1 of the drawings, input terminal 11 is coupled to the input of amplifier 12, the output of which is coupled to pulse shaper 13. The output of pulse shaper 13 is coupled to multivibrator 14, and pulse shapers 16, 17, 18, and 29. The output of multivibrator 14 is coupled to oscillator 21, the output of which is passed through variable phase shifter 22 to amplifier 23. The output of amplifier 23 is taken through cathode follower 24 to pulse shaper 26 and coincidence circuit 27. The output of pulse shaper 26 is coupled to the input of delay line 28. The output of coincidence circuit 27 is coupled to pulse shaper 29. The output of pulse shaper 29 is coupled to the input of delay line 31 and to an input of coincidence circuit 32. The output of delay line 31 is coupled to coincidence circuit 27. The output of coincidence circuit 32 is coupled through pulse shaper 18 to the input of delay line 33, the output of which is coupled to an input of coincidence circuit 32. Also coupled to the output of pulse shaper 18 is coincidence circuit 34, the output of which is coupled through pulse shaper 17 to the input of delay line 36, the output of which is coupled back to an input of coincidence circuit 34. The output of pulse shaper 16 is coupled to the input of delay line 37.

Delay line 28 has a plurality of output taps indicated generally at 38 which are connected to the input contacts of switch 39. Delay line 31 has a plurality of output taps indicated generally at 41 which are connected to the input contacts of switch 42. Delay line 33 has a plurality of output taps indicated generally at 43 which are connected to the input contacts of switch 44. Delay line 36 has a plurality of output taps indicated generally at 46 which are connected to the input contacts of switch 47. Delay line 37 has a plurality of output taps indicated generally at 48 which are connected to the input contacts of switch 49. Switches 39, 42, 44, 47, and 49 have output wipers 51, 52, 53, 54, and 56, respectively. These output wipers are capable of multiple 360° rotation and are all geared together in a mechanical ratio inversely proportional to the relative delay of their associated delay lines. Output tap 56 is connected to an input of coincidence circuit 57, another input of which is connected to output tap 54. Output taps 52 and 53 are connected to corresponding inputs of coincidence circuit 58, and output tap 51 is connected to one input of coincidence circuit 59. The outputs of coincidence circuits 57 and 58 are connected through inverters 61 and 62 respectively to the inputs of coincidence circuit 63. The output of coincidence circuit 63 is connected to the input of pulse shaper 64. The output of pulse shaper 64 is passed through an adjustable delay line 66 to an input of coincidence circuit 59. The output of coincidence circuit 59 is connected to pulse shaper 67, the output of which is connected to terminal 68.

*Operation*

Still referring to the block diagram of FIG. 1 the theory of operation will be described. A trigger or synchronizing pulse is applied at input terminal 11. This can be the keying pulse from radar equipment or the differentiated front of a waveform, the duration of which is being measured, etc. This synchronizing pulse is amplified in amplifier 12 and applied as a trigger to pulse shaper 13 which can be a conventional single swing. Pulse shaper 13 generates a sharp pip in synchronization with the synchronizing pulse which is applied as a further synchronization pulse to multivibrator 14. Multivibrator 14 is a monostable multivibrator which is used to turn-on oscillator 21. Oscillator 21 is preferably a crystal controlled Hartley oscillator which is cut-off by a fixed bias and gated on by multivibrator 14. The output of oscillator 21 is passed through a phase shifter 22 which is adjustable as a fine phase adjustment and amplified in amplifier 23. Cathode follower 24 then couples the output of amplifier 23 to delay line 28 through a pulse shaper 26, and to one input of coincidence circuit 27. Delay line 28 can be any of the well known lumped constant delay lines that is designed for a total delay time of 1.2 microseconds in this particular embodiment. It will be noted that this is the period or reciprocal of the crystal oscillator frequency. Thus, a pulse from pulse shaper 26 will reach the end of delay line 28 at the time the next pulse from pulse shaper 26 is starting down delay line 28. Output taps 38 are evenly spaced down the delay line 28 in increments of one-tenth or one-twentieth, for example, of the total delay time and are coupled to switch 39. Switch 39 selects then the tap corresponding to a delay time of interest to be fed to one input of coincidence circuit 59.

The output of pulse shaper 13 is also coupled through pulse shaper 29 to the input of delay line 31. Delay line 31 in the preferred embodiment has a delay time of ten times the delay of delay line 28 or 12.2 microseconds. It is to be noted at this point that 12.2 microseconds corresponds to one mile of radar range and 1.2 microseconds corresponds to one-tenth of a mile of radar range. Thus at a time 12.2 microseconds after the input pulse from pulse shaper 13 a pulse appears at the second input of coincidence circuit 27 which is designed to yield an ouput only when inputs are presented simultaneously. At that time the tenth pulse from cathode follower 24 will be applied to coincidence circuit 27 which will yield an output to pulse shaper 29 which is also coupled to the input of delay line 31. It is thus seen that as one pulse is leaving delay line 31 it will coincide with every tenth output pulse from cathode follower 24 and be coupled back to the input of delay line 31. This will continue so long as oscillator 21 is in operation. Delay line 31 has ten or twenty output taps evenly spaced in delay time in the same manner as delay line 28 and is coupled to the input contacts of switch 42 where a given delay increment can be selected through arm 52 to one input of coincidence circuit 58. The pulse from pulse shaper 13 is also supplied through pulse shaper 18 to the input of delay line 33. Delay line 33 delays the pulse in time 122 microseconds or ten miles of radar range at which time it is applied to one input of coincidence circuit 32 the other input of coincidence circuit 32 is fed from the output of pulse shaper 29 which as stated above will put out a pulse every 12.2 microseconds thus the first pulse of the output of coincidence circuit 32 will be coincident with the incoming synchronization pulse, through pulse shaper 18 and delay line 33, and the tenth pulse from pulse shaper 29, since the first pulse at the output of delay line 33 to coincidence circuit 32 will be delayed 122 microseconds. Delay line 33 is then divided in equal increments as delay lines 31 and 28 which are applied as an input to switch 44. Arm 53 of switch 44 then selects an increment of delay varying in this case from 1 to 10 miles or 12.2 to 122 microseconds, which is applied as an input to coincidence circuit 58.

The output of pulse shaper 13 is also passed through pulse shaper 17 to the input of delay line 36 this pulse is delayed 1220 microseconds or one hundred miles of radar range and applied as one input to coincidence circuit 34 the other input to coincide circuit 34 is taken from the output of pulse shaper 18 and coincidence circuit 34 will see a coincidence at the tenth pulse of pulse shaper 18, and thus apply an input to delay line 36 every 1220 microseconds or one hundred miles of radar range. Delay line 36 again has time incremental output taps applied as inputs to switch 47. Arm 54 of switch 47 selects the increment of delay of interest and applies it as one input to coincidence circuit 57.

The output of pulse shaper 13 is also passed through pulse shaper 17 to the input of delay line 36 this pulse is delayed 1220 microseconds or one hundred miles of radar range and applied as one input to coincidence circuit 34 the other input to coincidence circuit 34 is taken from the output of pulse shaper 18 and coincidence circuit 34 will see a coincidence at the tenth pulse of pulse shaper 18, and thus apply an input to delay line 36 every 1220 microseconds or one hundred miles of radar range. Delay line 36 again has time incremental output taps applied as inputs to switch 47. Arm 54 of switch 47 selects the increment of delay of interest and applies it as one input to coincidence circuit 57.

The output of pulse shaper 13 is also applied through pulse shaper 16 to the input of delay line 37 which delays the pulse a total of 12,200 microseconds or one thousand miles of radar range (this total delay time can be the maximum time between triggers or whatever is considered the maximum range of the equipment or time being measured). Delay line 37 also has ten or twenty output taps which represent equal increments of delay time which are applied to the input contact of switch 49. Arm 56 selects the increment of delay of interest and applies it as an input to coincidence circuit 57.

Figure 2:
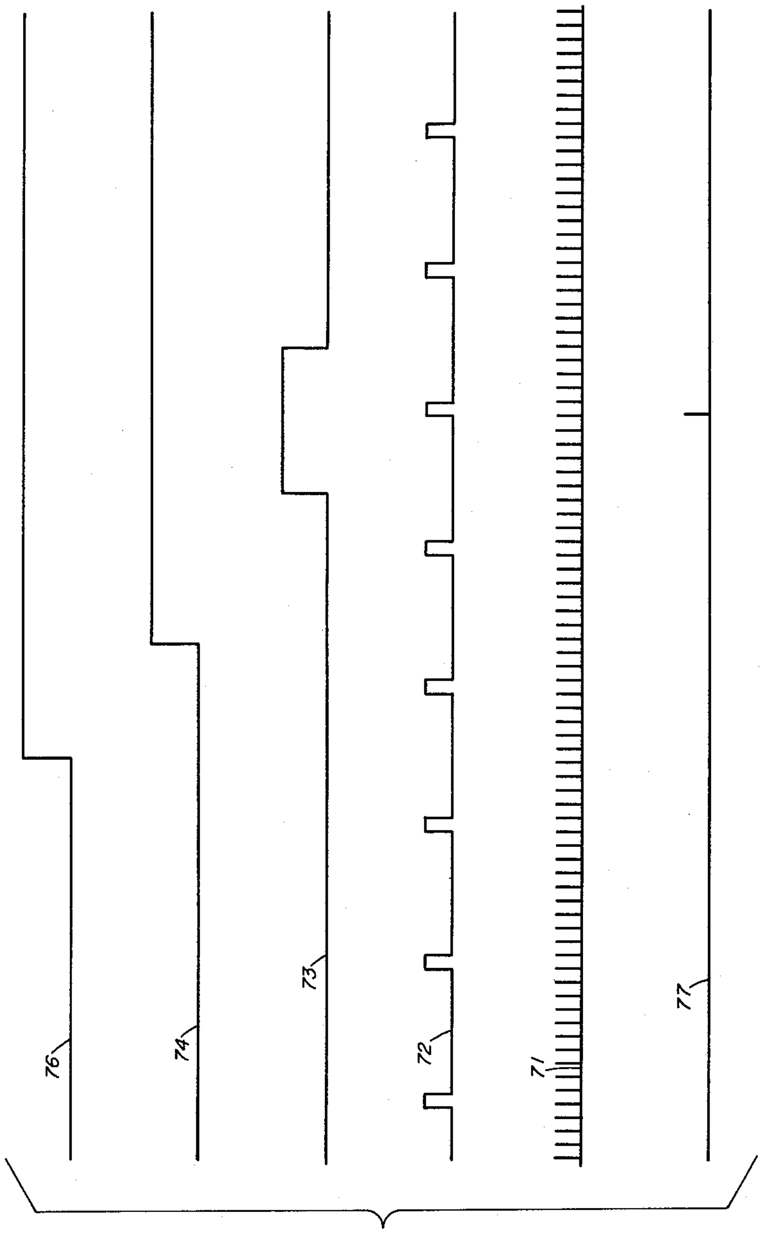
FIG. 2 illustrates the various waveforms present throughout the system at a given delay time selection.

Referring now to FIG. 2, there is shown a series of waveforms appearing throughout the block diagram of FIG. 1. Waveform 71 is the shaped output of oscillator 21 which appears at the input of pulse shaper 26 and coincidence circuit 27. If there are ten taps on delay line 28, for example, and the output selector switch is taken at the 4th tap from the right corresponding to .04 of a mile of range, or four times .12 microseconds, a pulse will appear at .04 of a mile of range, or .48 microseconds, after the incoming synchronization pulse at terminal 11, and every 1.2 microseconds thereafter to the input of coincidence circuit 59. Pulse shaper 26 is designed to produce a pulse as sharp as possible, consistent of course with the writing rate of the presentation or display oscilloscope, utilized in conjunction with the equipment. Coincidence circuit 27 yields a pulse 12.2 microseconds after the synchronization pulse which triggers pulse shaper 29, preferably a blocking oscillator, whose output is a pulse of a width almost the period of oscillator 21 shown as waveform 72 in FIG. 2. This is coupled to coincidence circuit 32 which again will yield an output 122 microseconds after the synchronization pulse. This pulse is approximately 12.2 microseconds wide so that there will always be a pulse from pulse shaper 18, shown as waveform 73 in coincidence therewith. The output from pulse shaper 18, which is applied to coincidence circuit 34, yields an output 1220 microseconds after the synchronization pulse to be sent down delay line 36. The width of the pulse of the output of pulse shaper 17 will then be 122 microseconds or ten miles in width, shown as waveform 74. The output of pulse shaped 16 will be a pulse one hundred miles in width or 1220 microseconds, shown as waveform 76.

Thus, the inputs to coincidence circuit 57 will be from delay line 37, shown as waveform 76, and from delay line 36, shown as waveform 74. In this illustration the switch 49 is set to 700 miles, switch 47 is set to 50 miles. Waveform 76 will then have its leading edge appear at 700 miles and gate the coincidence circuit for a period of 1220 microseconds or 100 miles of range to a time delay of 800 miles. Waveform 74 corresponding to the tens will be set then at 50 the output of coincidence circuit 57 will then be of the same duration in opposite phase as waveform 74 then is passed through inverter 61 and applied to one input of coincidence circuit 63. The selected output of delay line 31 as selected by arm 52 of switch 42 is shown as waveform 72, this will appear .4 mile of range after the synchronization pulse and every mile thereafter. Thus, there will always be one of these in synchronizism with pulse 73. Pulse 73 is taken out of delay line 33 by arm 53 and applied to the other input of coincidence circuit 58. Pulse 73 being the one mile in the present illustration, and set at 3 miles, and will appear 36.6 microseconds after the incoming trigger, and every ten miles of range or 122 microseconds thereafter. Thus, the output of coincidence circuit 58 will appear at the same time as the pulse 72 in coincidence with pulse 73, but again inverted in phase. This will be 752.4 microseconds to 753.5 microseconds. This pulse is an in phase inverter 62 and applied as a second input to coincidence circuit 63. The output of coincidence circuit 63 will then coincide with the input from inverter 62 shown as waveform 72 which is utilized to trigger pulse shaper 64. The output of pulse shaper 64 is passed through an adjustable delay line 66 into the second input of coincidence circuit 59. Coincidence circuit 59 will then select the pulse from delay line 28 which is in coincidence with the pulse from pulse shaper 64. This is utilized to trigger pulse shaper 67, the output of which is coupled to output terminal 68.

It has been pointed out that switches 39, 42, 44, 47 and 49 are ganged or geared together with a decreasing ratio increment of ten i.e. in the preferred embodiment the switch 39 corresponding to a hundredths of a mile delay is geared up at a ratio ten to one to range crank 10, arm 24 of switch 42 is geared to range crank 10 at a ratio of one to one, arm 53 of switch 44 is geared to range crank 10 at a reduction ratio of one to ten, arm 54 of switch 47 is geared to range crank 10 at a reduction ratio one to one hundred, and arm 56 of switch 49 is geared to range crank 10 at a reduction ratio of one to one thousand. It is also to be noted that the contacts of switch arms 51, 52, 53, 54 and 56 are of the type to make contact with the subsequent tap, upon rotation, before contact is broken with the preceding tap. This is to assure an output at any setting of range crank 10.

A precision variable delay pulse generator has been disclosed, which is relatively simple in construction and design and requires a minimum of components. It will be appreciated that the accuracy will be dependent only upon the oscillator, which can be crystal controlled, and delay time of the various delay lines, which again, are passive elements and can be manufactured with great precision requiring no adjustment or maintenance.

Obviously many modifications and variations of the present invention are possible in the light of the above teachings. It is therefore to be understood, that within the appended claims, the invention may be practiced otherwise than as specifically described.

What is claimed is:

1. A precision variable delay pulse generator comprising a synchronizing-pulse responsive gating means for supplying a gate pulse in synchronism with any synchronizing pulse applied thereto, a pulse generating means responsive to said gate pulse, a first time delay means having a minimum time delay connected to the output of said pulse generating means, a last time delay means having a maximum time delay connected to said synchronizing pulse, a plurality of intermediate time delay means having a total time delay varying incrementally from said minimum of said maximum, each of said intermediate time delay means having an input connected to said synchronizing pulse and having a feedback path comprising a total delay output connected to a first input of a different one of a plurality of coincidence circuits, the output of each one of said plurality of coincidence circuits connected to the input of said different one of said intermediate time delay means, a second input of each one of said coincidence circuits connected to the input of the preceding time delay means, a plurality of intermediate time delay output taps on each of said time delay means, a separate switching means associated with each of said time delay means operable to select any one of said output taps, said output taps connected for picking off a given increment of delay from the time delay means connected thereto; and coincidence means for passing a pulse when the signals at the outputs of said switches are all in coincidence.

2. A precision variable delay pulse generator comprising a synchronizing pulse responsive gating means for generating a gate pulse upon application of a synchronizing pulse, generating means for generating a chain of pulses at a predetermined frequency during said gate pulse, said pulse generator connected and responsive to the output of said gating means, a series of time delay means for delaying pulses different predetermined increments of time varying from a first time delay means having a time delay equal to a multiple of the pulse generator period to a last time delay means having a time delay equal to a multiple of said first time delay means, each of said time delay means having a total delay output and a plurality of intermediate time delay output taps, the time delay between any two adjacent taps on any one delay means being equal, a separate feedback means associated with each of said pulse delay means, each of said feedback means connecting the total delayed output of the associated pulse delay means to the input thereof, each of said feedback means associated with said pulse delay means intermediate said first and said last time delay means operable to produce a series of pulses having a width equal to the discrete intermediate delay periods of the immediately succeeding pulse delay means and starting in coincidence with a sub-multiple of the immediately preceding pulse delay means input pulses, the separate feedback means associated with the first time delay means operable to produce a series of pulses having a width equal to the discrete intermediate delay periods of the immediately succeeding pulse delay means and starting in coincidence with a sub-multiple of said pulse generator output pulses, the separate feedback means associated with the last time delay means operable to produce a pulse having a width equal to a predetermined maximum delay time and starting in coincidence with a sub-multiple of the immediately preceding pulse delay means input pulses, a separate switching means associated with each of said time delay means operable to select any one of said output taps, said output taps connected for picking off a given increment of delay from the time delay means connected thereto; and coincidence means for passing a pulse when the signals at the outputs of said switches are all in coincidence.

3. The precision variable delay pulse generator of claim 2 wherein said feed back means comprises coincidence means for synchronizing the pulses fed back and pulse shaping means for shaping the pulses fed back, said coincidence means and pulse shaping means connected in serial relationship.

4. A precision variable delay pulse generator comprising a synchronizing pulse responsive gating means, pulse generating means responsive to said gating means for generating pulses at a frequency $f$; a series of $n$ time delay means each of said time delay means delaying any signal applied thereto different predetermined periods of time, the first time delay means of said series having a delay period equal to $$\frac{1}{f}$$

the last time delay means of said series having a delay period equal to $$\frac{10^{n-1}}{f}$$

and the intermediate time delay means of said series having a delay period varying logarithmically in increments between $$\frac{10}{f} \text{ and } \frac{10^{n-2}}{f}$$

the input of said gating means coupled to the inputs of said intermediate and said last time delay means; a separate pulse shaping means associated with each of said delaying means for shaping said synchronizing pulse into pulses of predetermined widths varying logarithmically in increments from $$\frac{1}{10f} \text{ to } \frac{10^{n-2}}{f}$$

the output of each pulse shaping means connected to the input of the respective time delay means, a separate coincidence circuit associated with each of said time delay means; each of said time delay means having an input connected to the output of the associated pulse shaping means and an output connected to an input of the associated coincidence circuit, the associated coincidence circuit having an output connected to an input of the associated pulse shaping means and a second input connected to the input of the previous time delay means, the first coincidence circuit having an input connected to the output of said pulse generating means; each of said time delay means having a plurality of intermediate output taps, a separate switching means associated with each of said time delay means operable to select any one of said output taps, said output taps connected for picking off a given increment of delay from the time delay means connected thereto; and coincidence means for passing a pulse when the signals at the outputs of said switches are all in coincidence.

References Cited in the file of this patent

UNITED STATES PATENTS

| | | |
|---|---|---|
| 2,668,287 | Alvorez | Feb. 2, 1954 |
| 2,841,709 | Price | July 1, 1958 |
| 2,855,593 | Gloess | Oct. 7, 1958 |
| 2,860,243 | Roplan | Nov. 11, 1958 |
| 2,904,679 | Hoover | Sept. 15, 1959 |